(12) United States Patent
Yamashita et al.

(10) Patent No.: US 6,437,579 B1
(45) Date of Patent: Aug. 20, 2002

(54) SCREENING METHOD FOR A MULTI-LAYERED CERAMIC CAPACITOR (75) Inventors: Yukihito Yamashita, Eniwa; Akira Omi, Sapporo; Takeshi Iino, Chitose; Shigeki Inagaki, Eniwa; Tatsuro Kikuchi, Ikoma; Yoshinori Tomita, Eniwa, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/647,718
(22) PCT Filed: Feb. 2, 2000
(86) PCT No.: PCT/JP00/00550
§ 371 (c)(1), (2), (4) Date: Nov. 29, 2000
(87) PCT Pub. No.: WO00/46820
PCT Pub. Date: Aug. 10, 2000

(30) Foreign Application Priority Data

Feb. 4, 1999 (JP) .................................... 11-027585

(51) Int. Cl.$^7$ ............................................. G01R 31/12
(52) U.S. Cl. ....................................................... 324/548
(58) Field of Search ................................. 324/548, 500, 324/678, 679; 209/574; 320/166

(56) References Cited

U.S. PATENT DOCUMENTS 4,399,401 A * 8/1983 Levinson et al. ........... 324/548
4,644,259 A * 2/1987 Boser ......................... 324/548
5,510,719 A 4/1996 Yamamoto .................. 324/548

FOREIGN PATENT DOCUMENTS

| JP | 3-255374 | 11/1991 |
|----|----------|---------|
| JP | 7-14742 | 1/1995 |
| JP | 7-335482 | 12/1995 |
| JP | 8-213272 | 8/1996 |
| JP | 8-227826 | 9/1996 |
| JP | 8-306574 | 11/1996 |
| JP | 9-330855 | 12/1997 |
| JP | 10-293107 | * 11/1998 |

* cited by examiner

Primary Examiner—Christine K. Oda
(74) Attorney, Agent, or Firm—Wenderoth, Lind & Ponack, L.L.P.

(57) ABSTRACT

A method for screening multi-layered ceramic capacitors having internal defects at a high accuracy by superposing a direct-current constant current between external electrodes of a multi-layered ceramic capacitor having a defective part in an effective layer of the dielectric ceramic, raising the voltage between the external electrodes, and further feeding the direct-current constant current for a specific time after the voltage curve becomes flat, capacitors experiencing a sudden drop in the voltage between the external electrodes during the feeding time are sorted out and removed as a defective product.

20 Claims, 11 Drawing Sheets

SCREENING METHOD FOR A MULTI-LAYERED CERAMIC CAPACITOR

TECHNICAL FIELD

The present invention relates to a screening method for a multi-layered ceramic capacitor for guaranteeing the insulation resistance characteristic of the multi-layered ceramic capacitor.

BACKGROUND ART

Conventional screening methods for a multi-layered ceramic capacitor for guaranteeing the insulation resistance characteristic of the multi-layered ceramic capacitor include:

a withstand voltage testing method of applying a direct-current voltage exceeding a rated voltage several times repeatedly between external electrodes of the multi-layered ceramic capacitor, electrically breaking down defective parts of the dielectric ceramic layer, and removing the portions lowered in an insulation resistance;

an insulation resistance measurement testing method of measuring an insulation resistance after a specific time has passed from applying a direct-current voltage, and removing the portions not returning to the criteria value; and a leak current measurement testing method of measuring the leak current after a specific time has passed from applying a direct-current voltage, and removing the portions exceeding the criteria value, and by these methods, defective parts have been sorted out.

A higher insulation resistance characteristic is required for multi-layered ceramic capacitors. When evaluated by an acceleration test of applying a voltage exceeding the rated voltage in a high temperature and high humidity environment, a multi-layered ceramic capacitor being lowered in the insulation resistance value may however be determined out of ones approved by the conventional screening methods.

SUMMARY OF THE INVENTION

The present invention solves the problem of the prior art, and it is hence an object thereof to present a multi-layered ceramic capacitor capable of guaranteeing a high reliability without causing a deterioration of an insulation resistance characteristic even by an acceleration reliability test.

To solve the problem, the present invention is designed to superpose a direct-current constant current between external electrodes of a multi-layered ceramic capacitor, raise the voltage between the external electrodes, feed the direct-current constant current for a specific time after the voltage curve comes to show a flat characteristic, and sort and remove as a defective one if the voltage between the external electrodes drops suddenly during the feeding time.

According to this method, it is free from a deterioration of an insulation resistance characteristic even in the acceleration reliability test.

BEST MODE FOR CARRYING OUT THE INVENTION

An embodiment of the invention is described below while referring to the drawings.

Embodiment 1

First, according to a known manufacturing method of a multi-layered ceramic capacitor 1, a multi-layered ceramic capacitor having the size in length 1.6 mm, width 0.8 mm, and thickness 0.8 mm, the electrostatic capacitance of 0.22 $\mu$F, and the rated voltage of 16 V is prepared by using Ni in an internal electrode 7, Cu in an external electrode 6, and a ceramic material having B characteristic.

When direct-current constant current 4 is superposed and fed to a manufactured multi-layered ceramic capacitor and when a voltage is produced between external electrodes 6, the process of the multi-layered ceramic capacity falling into an insulation breakdown is explained. The screening was conducted at a constant humidity of 50 Rh % in order that superposed direct-current constant current 4 might not leak on the surface due to the humidity depositing on the surface of multi-layered ceramic capacitor 1 to securely produce a voltage between external electrodes 6, so that the voltage would be applied to an effective layer 8.

Figure 10:
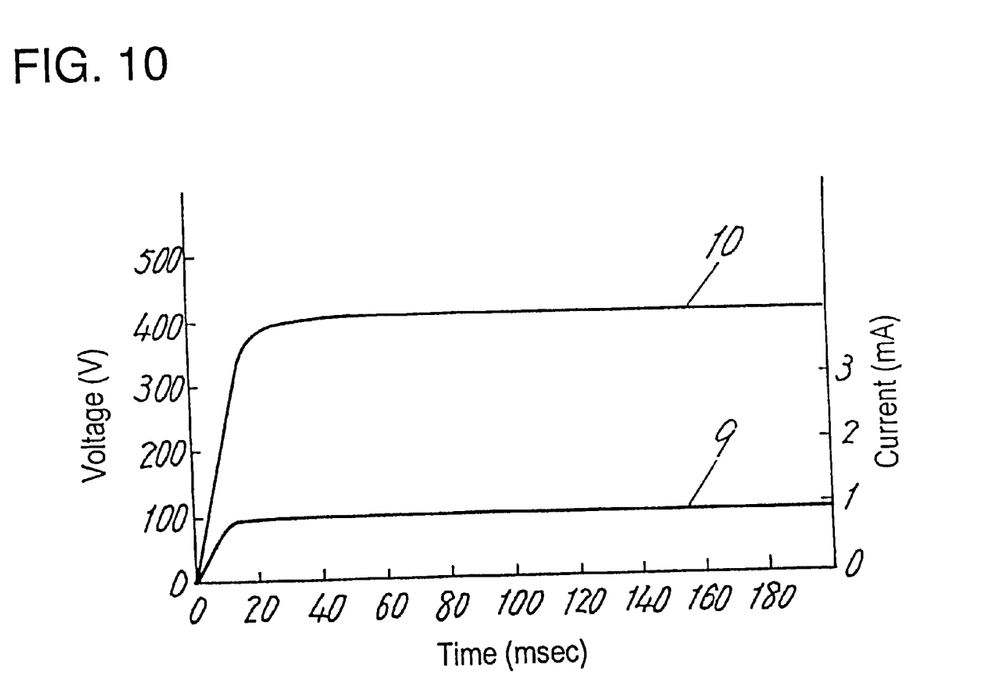
FIG. 10 is a characteristic diagram of a direct-current constant current superposed to a normal multi-layered ceramic capacitor and voltage between external electrodes.
Figure 11:
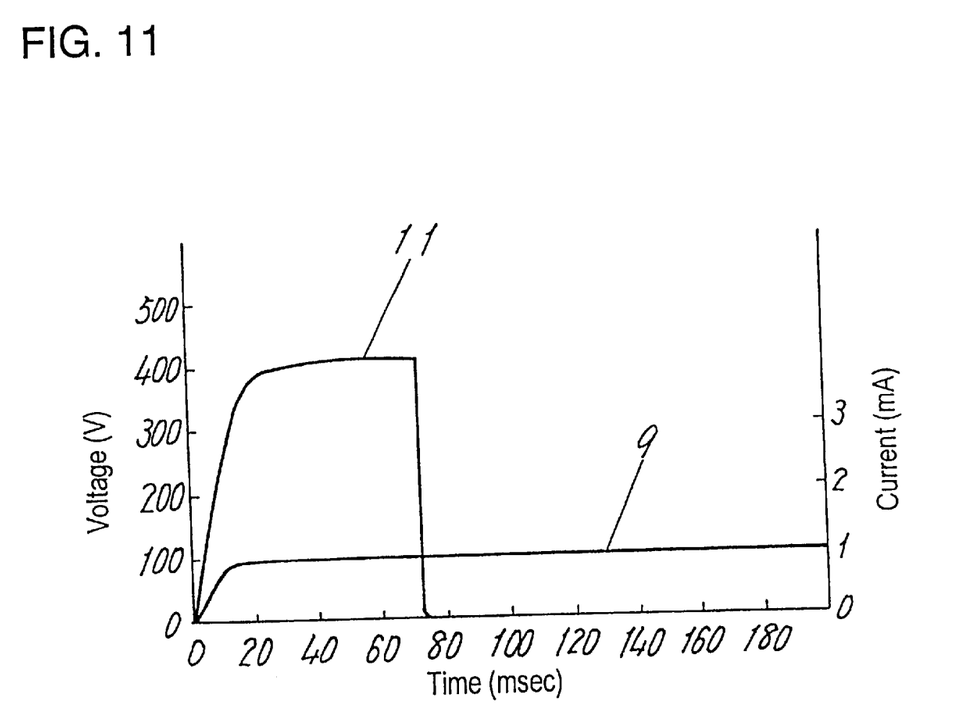
FIG. 11 is a characteristic diagram of a direct-current constant current superposed in a defective multi-layer ceramic capacitor and voltage between external electrodes.

Curve 9 of direct-current constant current 4 superposed to a multi-layered ceramic capacitor 1, and voltage curves 10, 11 produced between external electrodes 6 were observed on an oscilloscope 5, and the waveforms are shown in FIG. 10 and FIG. 11. FIG. 10 shows the waveform of a multi-layered ceramic capacitor 1 not falling in breakdown, and FIG. 11 shows the waveform of multi-layered ceramic capacitor 1 falling in insulation breakdown during the observation time.

Figure 1:
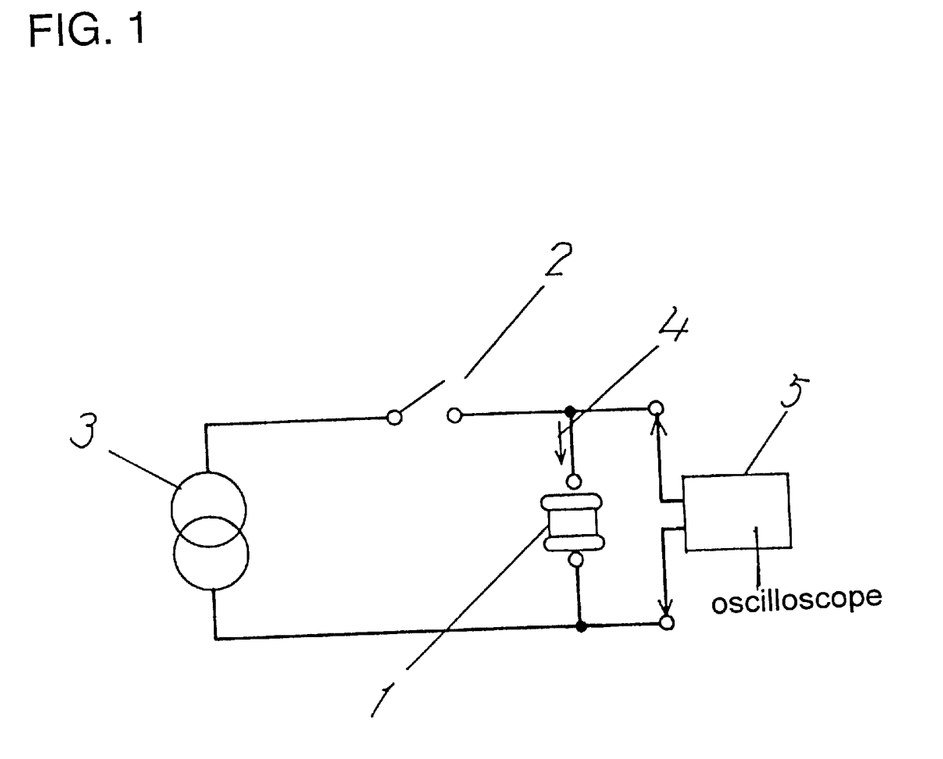
FIG. 1 is a circuit diagram used in an embodiment of the screening method for a multi-layered ceramic capacitor of the invention.

Using the circuit shown in FIG. 1, switch 2 is closed, and direct-current constant current 4 is superposed to a multi-layered ceramic capacitor 1 from a direct-current power source 3. Immediately after this, as shown in the direct-current voltage curves 10, 11 in FIG. 10 and FIG. 11, a voltage is produced between external electrodes 6 of the multi-layered ceramic capacitor 1, and the voltage is rising gradually. When direct-current constant current 4 is further superposed, voltage curves 10, 11 between external electrodes 6 of the multi-layered ceramic capacitor 1 become smaller in inclination, and the direct-current constant current 4 enters an energized state, and about 40 msec later, the curves become flat at around 400 V. When this state was further continued, after about 70 msec from the start of superposing, as shown in FIG. 11, insulation breakdown is caused in an effective layer 8 a having defective part 12 in the multi-layered ceramic capacitor 1, and the voltage curve 11 dropped suddenly.

Figure 9:
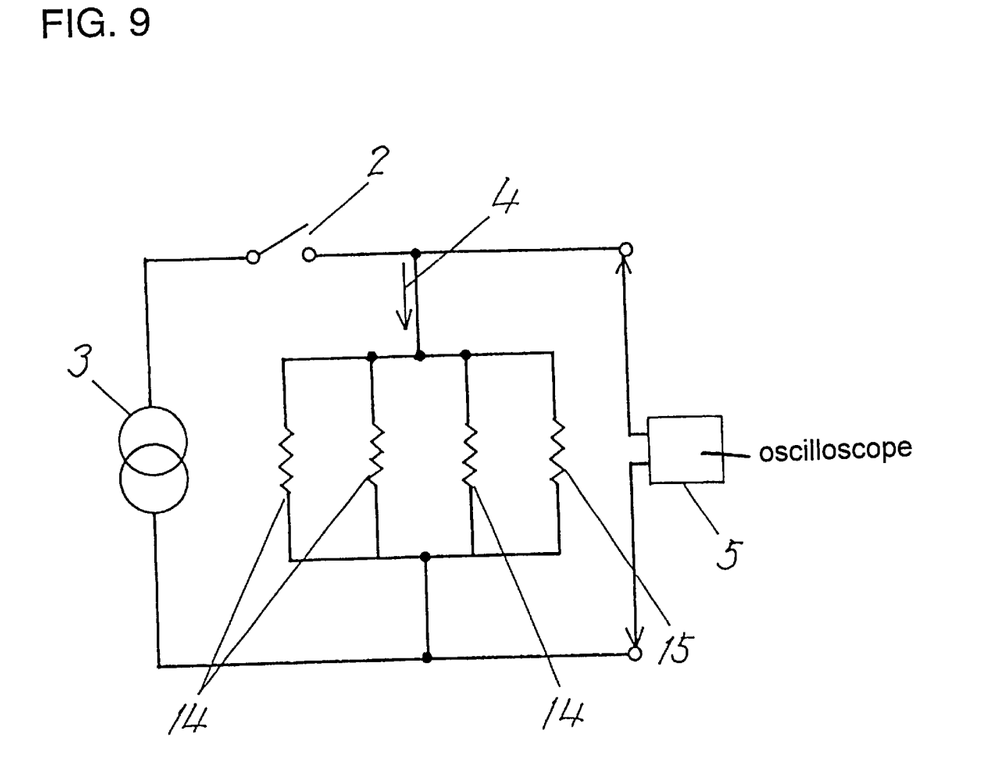
FIG. 9 is an equivalent circuit diagram of the insulation resistance of each effective layer of a defective multi-layered ceramic capacitor.

Estimating the cause of this insulation breakdown, insulation resistance 13 of the multi-layered ceramic capacitor 1 is, as shown in FIG. 9, equivalent to a parallel connection of the insulation resistances 14 and 15 of each effective layer 8. If there is an effective layer 8 having a defective part 12, and its insulation resistance 15 is low, by superposing the direct-current constant current 4, a larger current than that of the insulation resistance 14 of another effective layer 8 is distributed to the insulation resistance 15. At this time, since an identical potential is produced at both ends of the insulation resistances 14 and 15, a large current energy of the product of the voltage, current, and feeding time is consumed in the insulation resistance 15 in which a large divided current flows. It seems that extremely large heat is finally generated and the resister electrically breaks down in insulation and short-circuits, then, the voltage between both ends of the external electrodes 6 falls suddenly as indicated by the voltage curve 11 in FIG. 11.

Figure 2:
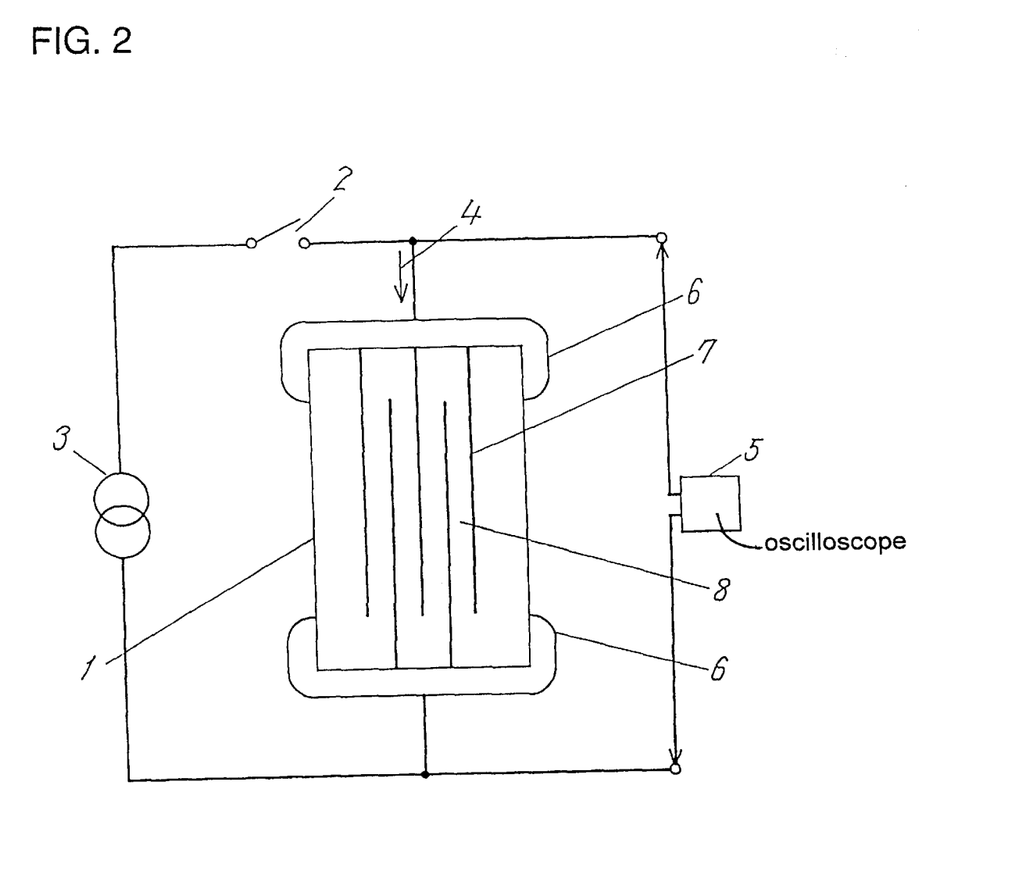
FIG. 2 is a conceptual diagram of a superposed feeding of a direct-current constant current to a normal multi-layered ceramic capacitor.
Figure 3:
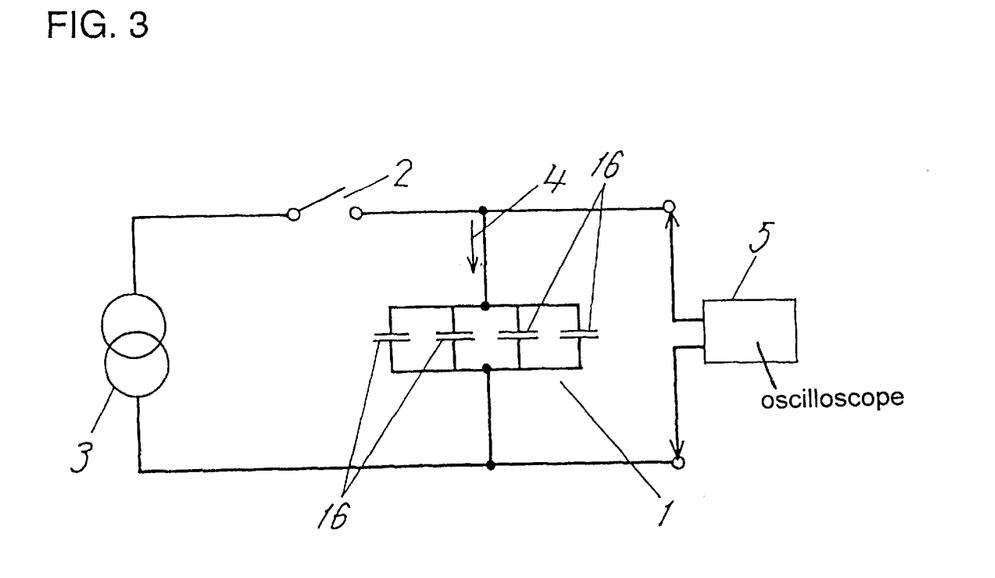
FIG. 3 is an equivalent circuit diagram of the electrostatic capacitance of each effective layer of a normal multi-layered ceramic capacitor.
Figure 4:
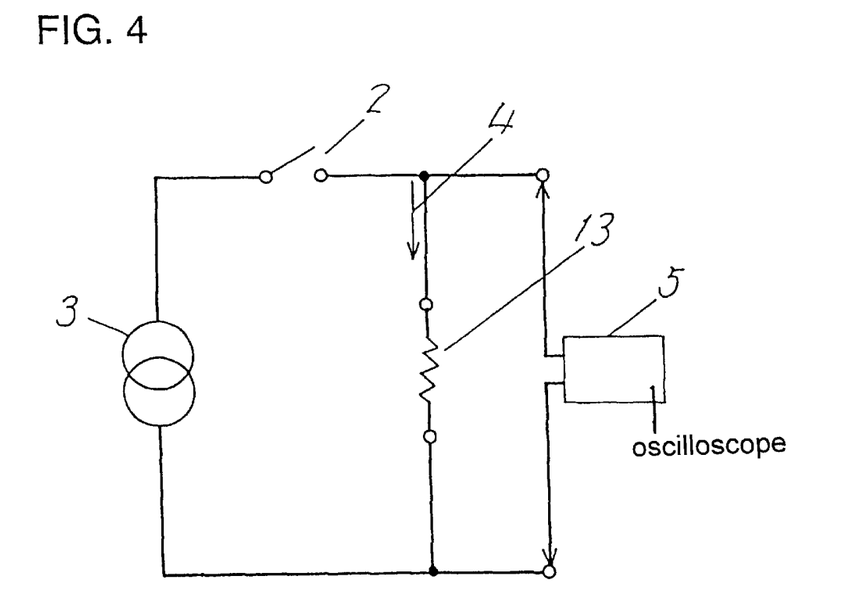
FIG. 4 is an equivalent circuit diagram of the insulation resistance of a normal multi-layered ceramic capacitor.
Figure 5:
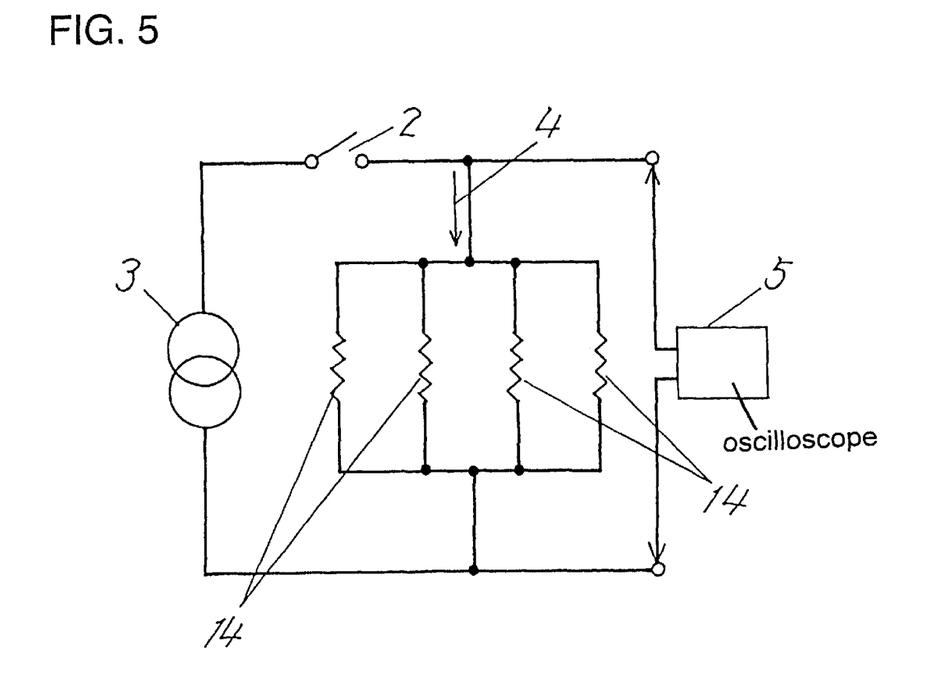
FIG. 5 is an equivalent circuit diagram of the insulation resistance of each effective layer of a normal multi-layered ceramic capacitor.
Figure 6:
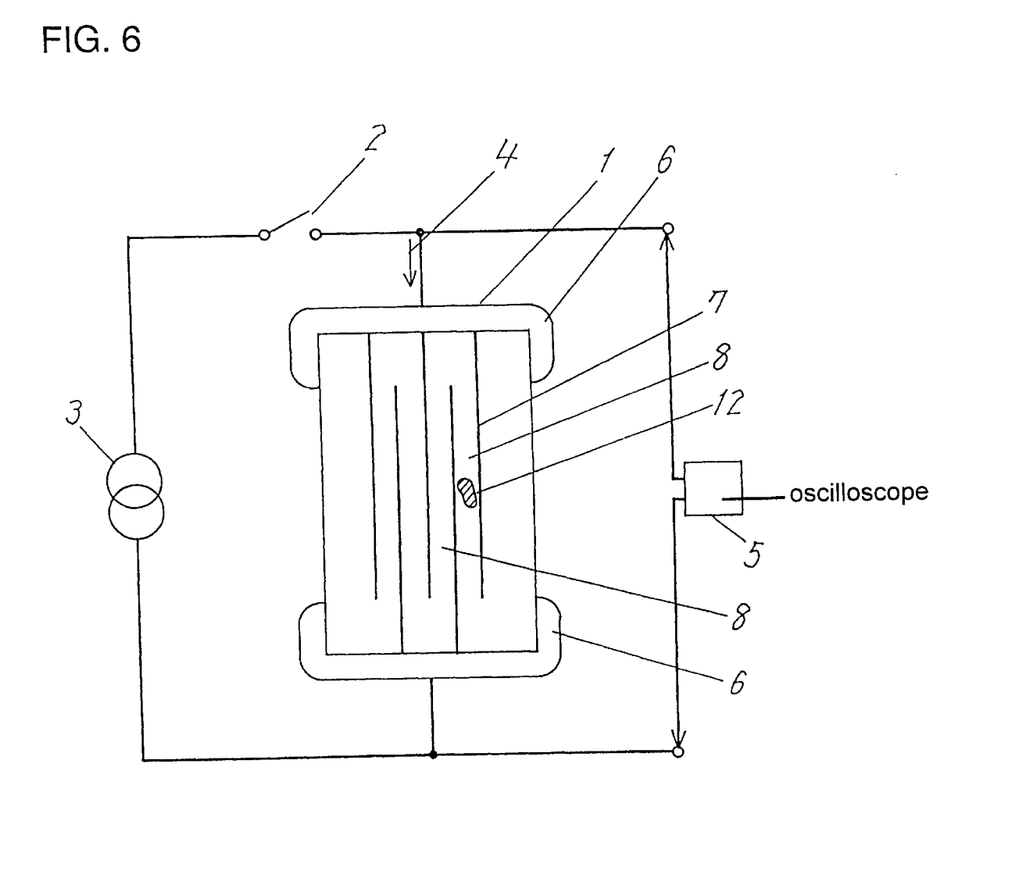
FIG. 6 is a conceptual diagram of a superposed feeding of a direct-current constant current to a defective multi-layered ceramic capacitor.
Figure 7:
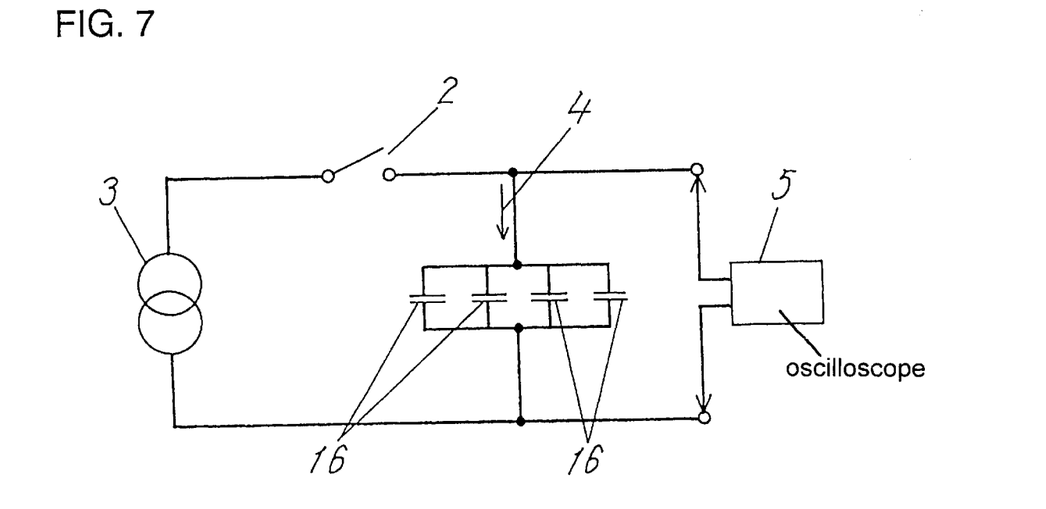
FIG. 7 is an equivalent circuit diagram of the electrostatic capacitance of each effective layer of a defective multi-layered ceramic capacitor.
Figure 8:
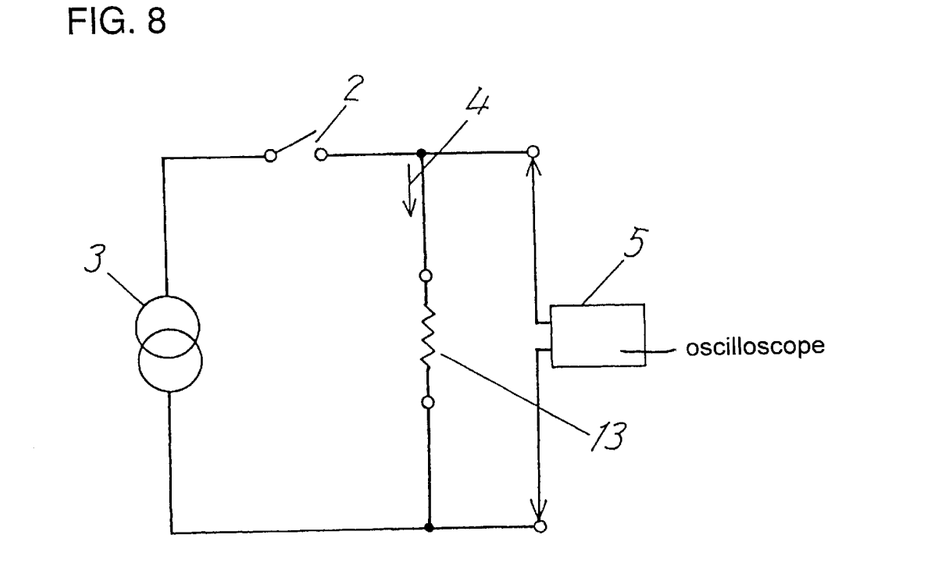
FIG. 8 is an equivalent circuit diagram of the insulation resistance of a defective multi-layered ceramic capacitor.

In the case of a multi-layered ceramic capacitor 1 not having a defective part 12 inside, however, as shown in FIG. 10, the phenomenon of the sudden falling of the voltage curve 10 at both ends of the external electrodes 6 is not confirmed within the observation time of 200 msec. It is considered that because the insulation resistance 14 of each effective layer 8 is uniform and the divided current flows uniformly in each insulation resistance 14, the heat is generated uniformly, and no effective layer 8 falls into an insulation breakdown. Such a capacitor as a multi-layered ceramic capacitor 1 having defective part 12 shown in FIG. 6 is broken down within a specific observation time, and the voltage curve 11 drops suddenly. By contrast, in the case of a multi-layered ceramic capacitor 1 not having a defective part 12 as shown in FIG. 2, the voltage curve 10 stably holds a specific constant value.

A direct-current constant current 4 is superposed between the external electrodes 6 of the multi-layered ceramic capacitor 1, and when the voltage between external electrodes 6 is accordingly raised until the voltage curve becomes flat, the dielectric ceramic becomes a low resistance element. When a specified direct-current constant current 4 is fed to it, a larger divided current than one in other parts flows in defective part 12 being lower in the insulation resistance of the dielectric ceramic. And therefore, by the electric energy of the product of the divided current and the applied voltage, a defective part 12 falls in insulation breakdown to be in a short-circuited state, and the voltage between the external electrodes 6 drops suddenly. A non-conformed product having such a defective part 12 can be sorted out and removed efficiently.

Figure 12:
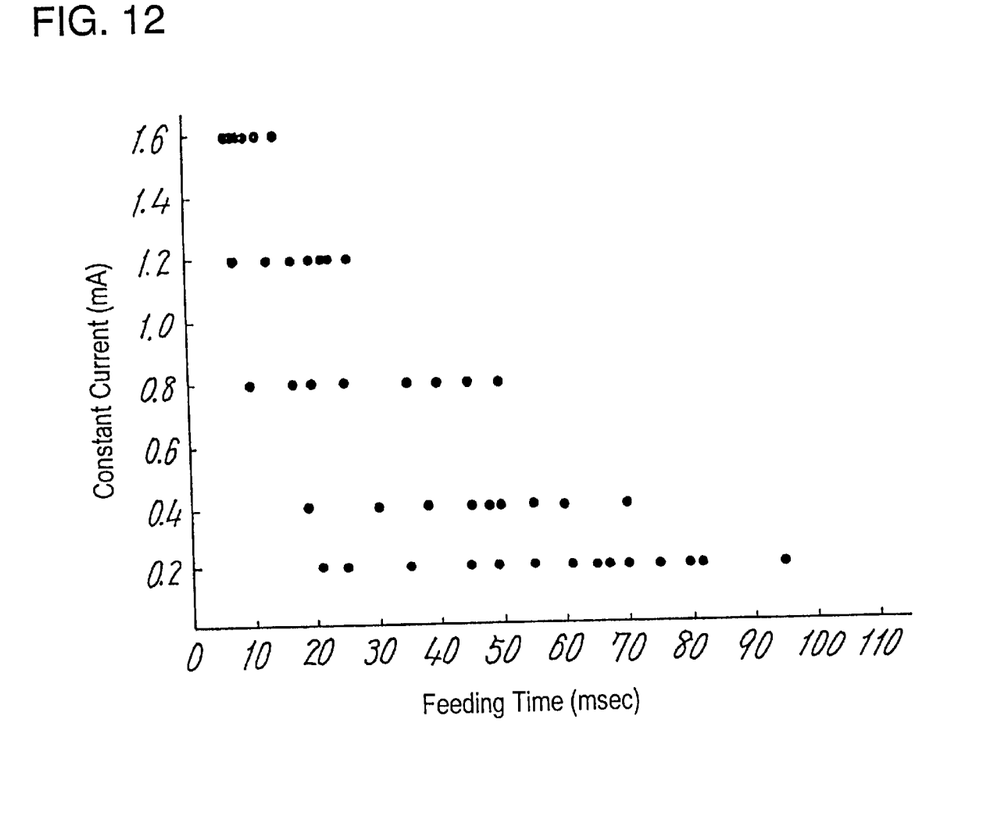
FIG. 12 is a diagram showing the relation between the feeding time until a defective multi-layered ceramic capacitor comes to an insulation breakdown and the current value.

The relation between the feeding time until the defective part 12 falls into insulation breakdown and the value of the superposed direct-current constant current 4 is shown in FIG. 12. The feeding time starts from the moment when the voltage curve occurring between the external electrodes 6 becomes flat. As shown in FIG. 12, if a superposed direct-current constant current 4 is small, it takes a longer time until reaching the insulation breakdown, and the fluctuation of the feeding time until breakdown is significant. When the feeding time is short, it is known that an insulation breakdown hardly occurs even if there is a defective part 12 inside.

On the basis of the data shown in FIG. 12, the screening is conducted by changing the feeding time and the direct-current constant current 4 as shown in Table 1, and the reliability of 100 normal multi-layered ceramic capacitors 1 in each screening condition are tested. The screening effects are evaluated in Table 1. In the reliability test conducted in the thermostatic oven at a temperature of 85 degree centigrade and a humidity of 85%, a direct-current voltage of 32 V is applied for 250 hours, and a capacitor having an insulation resistance 13 which falls below $10^{10}\Omega$ is judged to be defective. As a comparison, a normal capacitor selected by the conventional screening method that the capacitor having an insulation resistance 13 of $10^{10}\Omega$ or more is judged to be normal after applying the rated voltage of 16 V for one minute is evaluated as well, and the result of evaluation is also shown in Table 1.

TABLE 1

| | Division | | | | | | | | | |
|---|---|---|---|---|---|---|---|---|---|---|
| | Confirming of Effect of Screening of the Invention | | | | | | | | | |
| | Direction of Feeding | | | | | | | | | |
| | One Direction | | Two Directions | | One Direction | | Two Directions | | One Direction | |
| | Feeding Time | | | | | | | | | |
| | 10 msec | | 10 + 10 msec | | 20 msec | | 20 + 20 msec | | 50 msec | |
| Item | Defective Product | Reliability Test Result | Defective Product | Reliability Test Result | Defective Product | Reliability Test Result | Defective Product | Reliability Test Result | Defective Product | Reliability Test Result |
| Constant Current | | | | | | | | | | |
| 0.05 mA | 0 pc | NG: 7/100 | 0 pc | NG: 5/100 | 0 pc | NG: 8/100 | 0 pc | NG: 7/100 | 0 pc | NG: 8/100 |
| 0.1 mA | 0 pc | NG: 8/100 | 0 pc | NG: 7/100 | 0 pc | NG: 8/100 | 0 pc | NG: 7/100 | 1 pc | NG: 8/100 |
| 0.2 mA | 0 pc | NG: 7/100 | 0 pc | NG: 8/100 | 0 pc | NG: 7/100 | 1 pc | NG: 7/100 | 3 pcs | NG: 4/100 |
| 0.4 mA | 0 pc | NG: 7/100 | 0 pc | NG: 7/100 | 1 pc | NG: 7/100 | 2 pcs | NG: 5/100 | 5 pcs | NG: 4/100 |

TABLE 1-continued

| | | | | | | | | | |
|---|---|---|---|---|---|---|---|---|---|
| 0.8 mA | 2 pcs | NG: 8/100 | 4 pcs | NG: 4/100 | 3 pcs | NG: 5/100 | 5 pcs | NG: 3/100 | 7 pcs | NG: 0/100 |
| 1.6 mA | 6 pcs | NG: 0/100 | 8 pcs | NG: 0/100 | 7 pcs | NG: 0/100 | 9 pcs | NG: 0/100 | — |

Division

Confirming of Effect of Screening of the Invention

| | Direction of Feeding | | | | | | | | | | | |
|---|---|---|---|---|---|---|---|---|---|---|---|---|
| | Two Directions | | One Direction | | Two Directions | | One Direction | | Two Directions | | Conventional Screening | |
| | Feeding Time | | | | | | | | | | | |
| | 50 + 50 msec | | 80 msec | | 80 + 80 msec | | 100 msec | | 100 + 100 msec | | | |
| Item | Defective Product | Reliability Test Result | Defective Product | Reliability Test Result | Defective Product | Reliability Test Result | Defective Product | Reliability Test Result | Defective Product | Reliability Test Result | Defective Product | Reliability Test Result |
| Constant Current | | | | | | | | | | | | |
| 0.05 mA | 0 pc | NG: 7/100 | 1 pc | NG: 8/100 | 2 pcs | NG: 6/100 | 1 pc | NG: 7/100 | 2 pcs | NG: 7/100 | 3 pcs | NG: 5/100 |
| 0.1 mA | 2 pcs | NG: 5/100 | 8 pcs | NG: 0/100 | 7 pcs | NG: 0/100 | 9 pcs | NG: 0/100 | 10 pcs | NG: 0/100 | | |
| 0.2 mA | 4 pcs | NG: 3/100 | 9 pcs | NG: 0/100 | 8 pcs | NG: 0/100 | 9 pcs | NG: 0/100 | 7 pcs | NG: 0/100 | | |
| 0.4 mA | 7 pcs | NG: 0/100 | 8 pcs | NG: 0/100 | 9 pcs | NG: 0/100 | — | — | — | — | | |
| 0.8 mA | 10 pcs | NG: 0/100 | — | — | — | — | — | — | — | — | | |
| 1.6 mA | — | — | — | — | — | — | — | — | — | — | | |

As shown in Table 1, it is understood that capacitors having deteriorated insulation resistance in the reliability test cannot be screened completely by the conventional testing method. In the screening method of the present invention, by contrast, in the case of a superposed direct-current constant current 4 of 0.05 mA, even if the feeding time is as long as 100 msec, deterioration of an insulation resistance 13 is noted in the reliability test. In the case of a direct-current constant current 4 of 0.1 mA in one direction and in two directions, there is no deterioration of an insulation resistance 13 in the feeding time of 80 msec or more. Also in the case of direct-current constant current 4 of 0.2 mA, there is no deterioration in the feeding time of 80 msec or more as well as in the case of that of 0.1 mA. In the case of a direct-current constant current 4 of 0.4 mA, there is no deterioration in the feeding time of 80 msec or more in one direction feeding, or 50 msec in two direction feeding. In the case of a direct-current constant current 4 of 0.8 mA, there is no deterioration in the feeding time of 50 msec or more in both one direction and two direction feeding. And in the case of the direct-current constant current of 1.6 mA, there is no deterioration in the feeding time of 10 msec or more in both one direction and two direction feeding.

A defective multi-layered ceramic capacitor 1 in each condition occurring in the screening method of the invention was buried in the resin, and polished vertically to the laminating direction of the internal electrodes 7, and the internal structure was analyzed. A defective part 12 was found in an effective layer 8, and it was confirmed that opposing internal electrodes 7 of the defective part 12 were short-circuited. A multi-layered ceramic capacitor 1 deteriorating in an insulation resistance 13 was similarly analyzed in the reliability test, and a presence of defective part 12 was observed in all samples. In this way, a capacitor which deteriorates in the insulation resistance of the dielectric ceramic, but which does not fall into electric breakdown by applying direct-current constant current 4, can be securely sorted out and removed by this insulation resistance inspection.

It is therefore evident that the screening method of a multi-layered ceramic capacitor of the invention is an effective method for presenting a highly reliable multi-layered ceramic capacitor 1. As the screening condition, to apply the a direct-current constant current from one direction, preferably from two directions, and superpose direct-current constant current 4 of 0.1 mA or more for 80 msec or more is the optimum condition.

As a result, a defective part 12 which is low in the insulation resistance can be securely broken down in insulation by an electric energy, and the multi-layered ceramic capacitor having the defective part 12 can be securely sorted out and removed.

Figure 13:
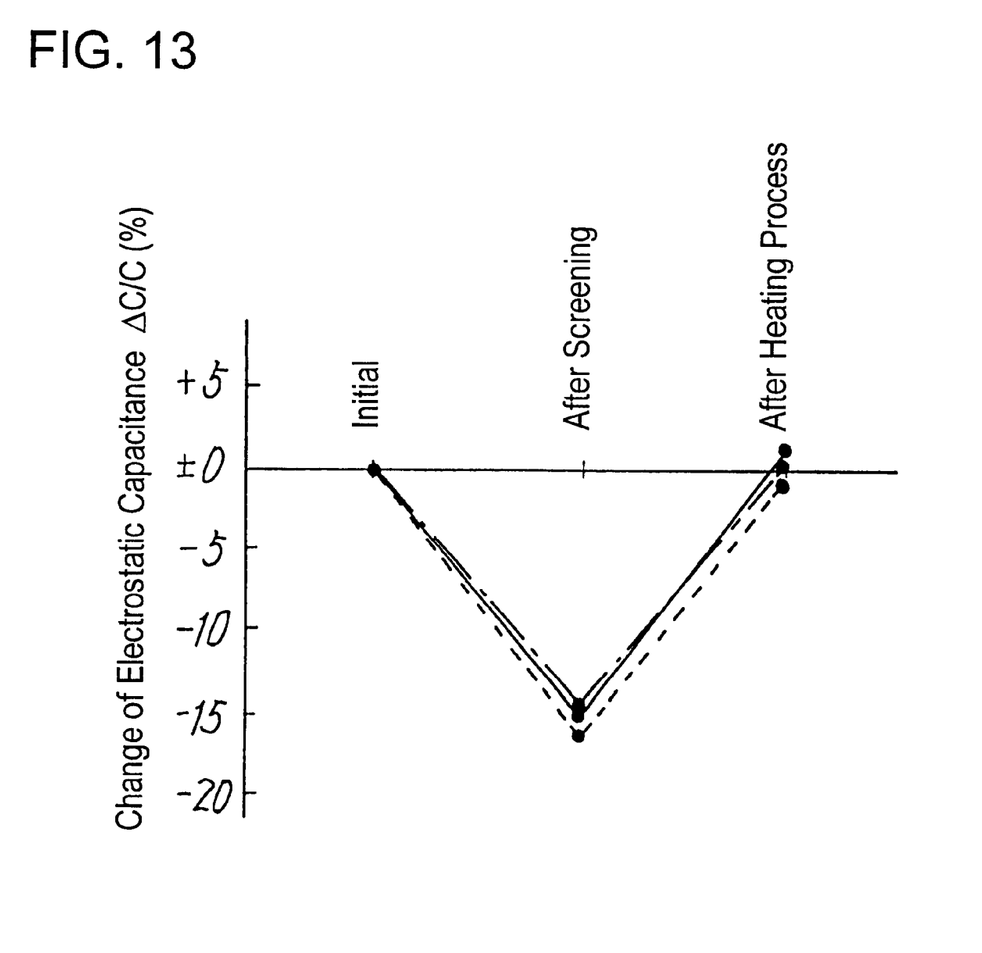
FIG. 13 is a diagram showing changes of electrostatic capacitance before and after screening and after a heating process.

As shown in FIG. 13, after screening of the invention, it is found that an electrostatic capacitance of a multi-layered ceramic capacitor 1 is lower by about 15% compared with the capacity before screening. This is because the dielectric ceramic layer of the capacitor 16 for composing an effective layer 8 is polarized by the voltage existing between the external electrodes 6, and the relative dielectric constant becomes smaller. Therefore, to return the electrostatic capacitance to a level before screening, it is necessary to heat the multi-layered ceramic capacitor 1 at a temperature higher than the curie point of the dielectric ceramic to depolarize securely to return to the non-polarized state. At first, measuring the electrostatic capacitance of the multi-layered ceramic capacitor 1 beforehand, preliminarily sorting out and removing capacitors that are not reaching the specified electrostatic capacitance due to abnormal insulation resistance of internal defects, screening is executed by feeding the direct-current constant current 4 only to those capacitors having defective parts 12 in the dielectric ceramic, with the electrostatic capacitance within the standard characteristic range. The number of sorting processes can be accordingly kept to a required minimum limit, and the working efficiency can be enhanced.

It is preferred to test in the environment of constant humidity so that the superposed direct-current constant current 4 may not leak on the surface of multi-layered ceramic capacitor 1 to cause a voltage between external electrodes 6, and that the voltage may be applied securely to the effective layer 8.

From the description herein, in the conventional insulation resistance measurement testing method, it is impossible to completely remove the multi-layered ceramic capacitor 1 having a defective part 12 which is one of the causes of deterioration of the insulation resistance 13 in a reliability acceleration test. The screening method of the invention is capable of completely removing a multi-layered ceramic capacitor 1 having an internal defective part 12, so that a highly reliable multi-layered ceramic capacitor 1 can be presented.

Industrial Applicability

According to the invention, by superposing a direct-current constant current between external electrodes of a multi-layered ceramic capacitor, raising the voltage between the external electrodes, applying the direct-current constant current for a specific time further from the moment the voltage curve becomes flat, and sorting out and removing the defective capacitors when the voltage between the external electrodes drops suddenly during the feeding time, it is possible to screens securely the multi-layered ceramic capacitor having an internal defect, which is one of the causes of deterioration of insulation resistance in the reliability acceleration test.

What is claimed is:

1. A screening method for screening a multi-layered ceramic capacitor comprising: a multi-layered body which is formed by laminating a dielectric ceramic layer and an internal electrode alternately in plural layers and which has a first surface and a second surface from which a first internal electrode and a second internal electrode that is opposite to the first electrode across the dielectric ceramic layer protrude, respectively; a first external electrode exposed on the first surface to connect to the first internal electrode; and a second external electrode exposed on the second surface to connect to the second internal electrode, said screening method comprising:
   (a) a step for feeding a first direct-current constant current between the first external electrode and the second external electrode;
   (b) a step for further feeding the first direct-current constant current for a specific time after variation of a voltage between the first external electrode and the second external electrode becomes flat; and
   (c) a step for selecting a multi-layered ceramic capacitor where the voltage does not fall during said step (b).

2. The screening method of claim 1, further comprising:
   (d) a step for feeding a second direct-current constant current whose direction is opposite of the first direct-current constant current between the first external electrode and the second external electrode of the multi-layered ceramic capacitor selected at said step (c);
   (e) a step for further feeding the second direct-current constant current for a specific time after variation of a voltage between the first external electrode and the second external electrode becomes flat; and
   (f) a step for selecting a multi-layered ceramic capacitor where the voltage does not fall during said step (e).

3. The screening method of claim 2, further comprising:
   (g) a step for selecting a multi-layered ceramic capacitor whose insulation resistance is at least a specific value from the multi-layered ceramic capacitors selected at said step (f).

4. The screening method of claim 3, further comprising:
   a step for heating, at a specific temperature, the multi-layered ceramic capacitor selected at said step (g).

5. The screening method of claim 4, wherein the specific temperature is at least a Curie-temperature of the dielectric ceramic layer.

6. The screening method of claim 1, wherein said step (a), said step (b), and said step (c) are performed in a constant humidity atmosphere.

7. The screening method of claim 1, wherein the first direct-current constant current is at least 0.1 mA.

8. The screening method of claim 1, wherein the first direct-current constant current is applied for at least 80 msec.

9. The screening method of claim 1, further comprising:
   (h) a step for measuring, before said step (a), an electrostatic capacitance of a multi-layered ceramic capacitor; and
   (i) a step for selecting, before said step (a), a multi-layered ceramic capacitor whose electrostatic capacitance measured at said step (h) is in a specific range; and
   wherein said step (a) is performed to the multi-layered ceramic capacitor selected at said step (i).

10. The screening method of claim 1, further comprising:
    a step for observing the direct-current constant current and the voltage by using an oscilloscope.

11. A method for screening a multi-layered ceramic capacitor, wherein the multi-layered ceramic capacitor comprises: a multi-layered body which is formed by laminating a dielectric ceramic layer and an internal electrode alternately in plural layers and which has a first surface and a second surface from which a first internal electrode and a second internal electrode that is opposite to the first electrode across the dielectric ceramic layer protrude, respectively; a first external electrode exposed on the first surface to connect to the first internal electrode; and a second external electrode exposed on the second surface to connect to the second internal electrode, said method comprising:
    feeding a first direct-current constant current between the first external electrode and the second external electrode;
    further feeding the first direct-current constant current for a specific time after variation of a voltage between the first external electrode and the second external electrode becomes flat; and
    selecting a multi-layered ceramic capacitor where the voltage does not fall during said further feeding the first direct-current constant current.

12. The method of claim 11, further comprising:
    feeding a second direct-current constant current whose direction is opposite of the first direct-current constant current between the first external electrode and the second external electrode of the multi-layered ceramic capacitor selected at said selecting;
    further feeding the second direct-current constant current for a specific time after variation of a voltage between the first external electrode and the second external electrode becomes flat; and
    selecting a multi-layered ceramic capacitor where the voltage does not fall during said further feeding the second direct-current constant current.

13. The method of claim 12, further comprising:
    selecting a multi-layered ceramic capacitor whose insulation resistance is at least a specific value from the multi-layered ceramic capacitors selected at said selecting a multi-layered ceramic capacitor where the voltage does not fall during said further feeding the second direct-current constant current.

14. The method of claim 13, further comprising:

heating, at a specific temperature, the multi-layered ceramic capacitor selected at said selecting a multi-layered ceramic capacitor whose insulation resistance is at least a specific value.

15. The method of claim 14, wherein the specific temperature is at least a Curie-temperature of the dielectric ceramic layer.

16. The method of claim 11, wherein said feeding, said further feeding, and said selecting is performed in a constant humidity atmosphere.

17. The method of claim 11, wherein the first direct-current constant current is at least 0.1 mA.

18. The method of claim 11, wherein the first direct-current constant current is applied for at least 80 msec.

19. The method of claim 11, further comprising:

measuring, before said feeding, an electrostatic capacitance of a multi-layered ceramic capacitor; and selecting, before said feeding, a multi-layered ceramic capacitor whose electrostatic capacitance measured at said measuring is in a specific range; and wherein said feeding is performed to the multi-layered ceramic capacitor selected at said selecting the multi-layered ceramic capacitor whose electrostatic capacitance measured at said measuring is in a specific range.

20. The method of claim 11, further comprising:

observing the direct-current constant current and the voltage by using an oscilloscope.

* * * * *